(12) United States Patent  
Chudzik et al.

(10) Patent No.: US 8,835,292 B2  
(45) Date of Patent: Sep. 16, 2014

(54) METHOD OF MANUFACTURING SEMICONDUCTOR DEVICES INCLUDING REPLACEMENT METAL GATE PROCESS INCORPORATING A CONDUCTIVE DUMMY GATE LAYER

(71) Applicants: International Business Machines Corporation, Armonk, NY (US); Globalfoundries Inc., Grand Cayman Islands (KY)

(72) Inventors: Michael P. Chudzik, Danbury, CT (US); Min Dai, Mahwah, NJ (US); Xiang Hu, Malta, NY (US); Jinping Liu, Hopewell Junction, NY (US); Yanxiang Liu, Wappingers Falls, NY (US); Xiaodong Yang, Hopewell Junction, NY (US)

(73) Assignees: International Business Machines Corporation, Armonk, NY (US); Global Foundries, Inc., Grand Cayman Islands (KY)

( * ) Notice: Subject to any disclaimer, the term of this patent is extended or adjusted under 35 U.S.C. 154(b) by 58 days.

(21) Appl. No.: 13/664,744

(22) Filed: Oct. 31, 2012

(65) Prior Publication Data

US 2014/0120708 A1    May 1, 2014

(51) Int. Cl.  
*H01L 21/3205* (2006.01)

(52) U.S. Cl.  
USPC .......................................................... 438/585

(58) Field of Classification Search  
CPC ................... H01L 29/66545; H01L 29/66583  
USPC .......................................................... 438/585  
See application file for complete search history.

(56) References Cited

U.S. PATENT DOCUMENTS

| 6,200,866 | B1 | 3/2001 | Ma et al. |
|---|---|---|---|
| 6,759,695 | B2 | 7/2004 | Ma et al. |
| 7,314,802 | B2 | 1/2008 | Zhu et al. |
| 7,713,806 | B2 | 5/2010 | Zhu et al. |
| 8,058,137 | B1 | 11/2011 | Or-Bach et al. |
| 2008/0211023 | A1 | 9/2008 | Shino |
| 2009/0057769 | A1* | 3/2009 | Wei et al. ................. 257/369 |
| 2009/0206406 | A1 | 8/2009 | Rachmady et al. |
| 2010/0124818 | A1 | 5/2010 | Lee et al. |
| 2011/0233522 | A1 | 9/2011 | Cohen et al. |

\* cited by examiner

*Primary Examiner* — Bradley K Smith  
(74) *Attorney, Agent, or Firm* — Yuanmin Cai; Hoffman Warnick LLC

(57) ABSTRACT

A method of manufacturing a semiconductor device including a replacement metal gate process incorporating a conductive dummy gate layer (e.g., silicon germanium (SiGe), titanium nitride, etc.) and a related are disclosed. The method includes forming an oxide layer on a substrate; removing a gate portion of the oxide layer from the substrate in a first region of the semiconductor device; forming a conductive dummy gate layer on the semiconductor device in the first region; and forming a gate on the semiconductor device, the gate including a gate conductor disposed in the first region and directly connected to the substrate.

19 Claims, 6 Drawing Sheets

METHOD OF MANUFACTURING SEMICONDUCTOR DEVICES INCLUDING REPLACEMENT METAL GATE PROCESS INCORPORATING A CONDUCTIVE DUMMY GATE LAYER

TECHNICAL FIELD

Embodiments of this disclosure relate generally to semiconductor devices and, more particularly, to a method of manufacturing a semiconductor device including a replacement metal gate process incorporating a conductive dummy gate layer (e.g., silicon germanium (SiGe), titanium nitride, etc.).

BACKGROUND

In semiconductor devices, components including gate dielectric devices and structures (e.g., metal gates) are frequently included in designs to perform a variety of functions, decrease device size and increase device performance and functionality. Gate dielectric devices may be formed in gate oxides (e.g., MOSFET gate oxides) with varying dimensions and compositions as determined by design and/or functional intent. Some common gate dielectric devices include thick gate oxide regions (e.g., gates with a thick gate dielectric relative to thin gate oxide regions) for connection with input and output (I/O) devices, and thin gate oxide regions (e.g., gates with a thin gate dielectric relative a thick gate oxide region) for connection with logic devices, high performance devices, etc.

Traditionally, formation of gate dielectric devices is achieved through replacement gate methods using aggressive etching techniques. During these processes, a thick gate oxide layer is deposited over the substrate/device followed by deposition of a silicon layer (e.g., a dummy gate layer) upon the thick gate oxide layer. Portions of these layers are then patterned, implanted, and/or selectively etched down to the substrate before application of interfacial layers, high-K gate dielectrics, etc. Once these regions are defined and an insulator has been deposited and polished about them on the substrate, an aggressive etch is performed to remove the dummy gate layer from within the gate regions and/or to remove select remaining portions of the thick gate dielectric from within the gate regions. This aggressive etching processing these regions for deposition and formation of gate structures and/or devices. However, in creating gate dielectric devices in thick gate oxide regions, these methods, particularly aggressive etching, may be difficult to control, resulting in imprecise devices, damaged surfaces, unintentional layer residue, inconsistent etching in device corners, and/or damage to insulator dielectrics or other components of the semiconductor device. Further, in an effort to avoid and/or limit the negative effects of aggressive etching, some processes may stop etching while a small portion of the oxide layer (e.g., a dummy layer, a residue material layer, etc.) remains on the substrate. This residue material may decrease device efficiency and/or performance when it remains buried within the thin gate dielectric of high performance logic devices.

For example, FIG. 1 is a demonstrative illustration of a cross sectional view of a portion of a semiconductor device 100 including a dummy gate 102 formed through known methods. Semiconductor device 100 may include a substrate 110 (e.g., silicon layer) upon which dummy gate 102 is disposed and/or formed. Dummy gate 102 may include a spacer 170 formed on substrate 110 and between portions of a dielectric layer 120. A barrier layer 130 may be formed between spacer 170 and a dummy gate conductor 150 (e.g., poly-Silicon). A residual layer of thick gate oxide 140 (e.g., a dummy layer, silicon dioxide ($SiO_2$), etc.) may remain between gate conductor 150 and substrate 110 as a result limitations in the formation process (e.g., aggressive etching tolerance). Residual layer of thick gate oxide 140 may interfere with and/or limit semiconductor device 100 performance or design considerations. Turning to FIG. 2, a first gate region 202 and a second gate region 204 may be disposed on a substrate 210 of a semiconductor device 200 in accordance with known methods. First gate region 202 and second gate region 204 may both include a residual layer of thick gate oxide 240 which remains from gate formation processes. An interlayer dielectric 222 may separate first gate region 202 and second gate region 204. During formation of semiconductor device 200, first gate region 202 may be formed into a thin gate region (e.g., a region for high performance devices, a region for logic devices, a region with a thin gate dielectric, etc.) and second gate region 204 may be formed into a thick gate region (e.g., a region for input/output devices, a region with a thick gate dielectric region, etc.). However, aggressive etching may be performed on first gate region 202 to form the thin gate region, this aggressive etching which may damage portions of second gate region 204 and require an undesirable residue of gate oxide 240 in first gate region 202.

BRIEF SUMMARY

A first aspect of the disclosure provides a method including: forming an oxide layer on a substrate; removing a gate portion of the oxide layer from the substrate in a first region of the semiconductor device; forming a conductive dummy gate layer on the semiconductor device in the first region; and forming a gate on the semiconductor device, the gate including a gate conductor disposed in the first region and directly connected to the substrate.

A second aspect of the disclosure provides a method of forming a semiconductor device, the method including: providing a substrate; forming an oxide layer on the substrate, the oxide layer including a first region and a second region; removing a gate portion of the oxide layer from the substrate in a first region of the semiconductor device, the removing includes converting the first region to a substantially oxide free region; forming a dummy gate on the semiconductor device in the first region; and forming a gate on the semiconductor device through replacement metal gate processes, the replacement metal gate processes being performed on the dummy gate.

A third aspect of the disclosure provides a method of forming a semiconductor device, the method comprising: forming an oxide layer on a substrate, the oxide layer including a first portion on a first region of the substrate and a second portion on a second region of the substrate; removing the first portion of the oxide layer from the first region of the substrate; forming a conductive dummy gate layer that substantially covers the first region of the substrate and the second portion of the oxide layer; and forming a first gate in the first region of the substrate and a second gate in the second region of the substrate, the first gate including a first gate conductor directly connected to the substrate and the second gate including a second gate conductor formed on the second portion of the oxide layer.

These and other aspects, advantages and salient features of the invention will become apparent from the following detailed description, which, when taken in conjunction with the annexed drawings, where like parts are designated by like

BRIEF DESCRIPTION OF THE DRAWINGS

The above and other aspects, features and advantages of the invention will be better understood by reading the following more particular description of the invention in conjunction with the accompanying drawings.

Figure 1:
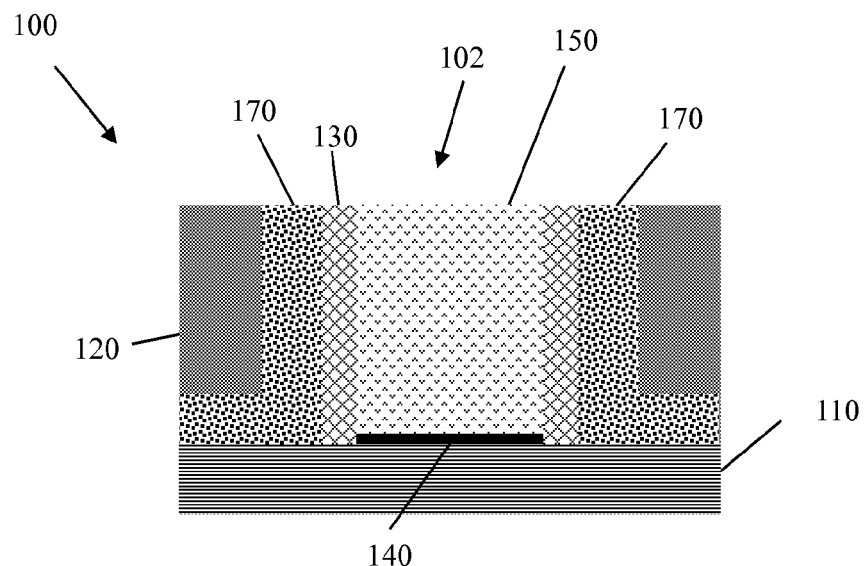
FIG. 1 is a demonstrative illustration of a graphical representation of a profile of a semiconductor device formed according to known methods.
Figure 2:
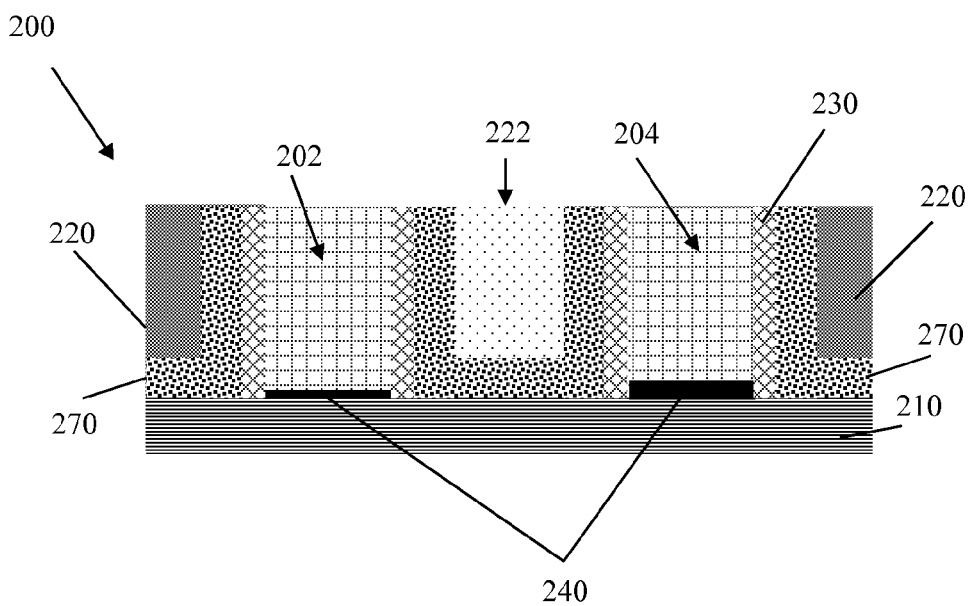
FIG. 2 is a demonstrative illustration of a graphical representation of a profile of a portion of a semiconductor device formed according to known methods.

It is noted that the drawings of the disclosure are not necessarily to scale. The drawings are merely schematic representations, not intended to portray specific parameters of the invention. The drawings are intended to depict only typical embodiments of the invention, and therefore should not be considered as limiting the scope of the invention. It is understood that in embodiments shown and described in the drawings, like numbering may represent like elements and that redundant explanation of these elements has been omitted for clarity. Finally, it is understood that the components of the drawings and their accompanying descriptions may be applied to any embodiment described herein.

DETAILED DESCRIPTION

In the formation of integrated circuits (IC) with multiple types (e.g., 2 types, 3 types, etc) of transistor with different gate dielectric structures, (e.g., I/O structures, low performance structures, thick oxide regions, etc., and one for logic devices, high performance devices, thin oxide regions, etc.) manufacturing typically includes creation of thick oxide dielectrics for the I/O transistor first, then at the location of the higher performance thin oxide transistor, the thick oxide is removed and a thin oxide (high-k) dielectric is formed. Some prior methods remove the thick oxide at the high performance transistor area after opening the poly-Si. In contrast to conventional approaches, this invention removes the thick oxide at the high performance transistor area right after thick oxide formation. Instead of following the previously discussed deposition of poly-Si for the dummy gate, this invention uses materials such as SiGe, TiN etc. which may be easier to etch without using DHF.

Figure 3:
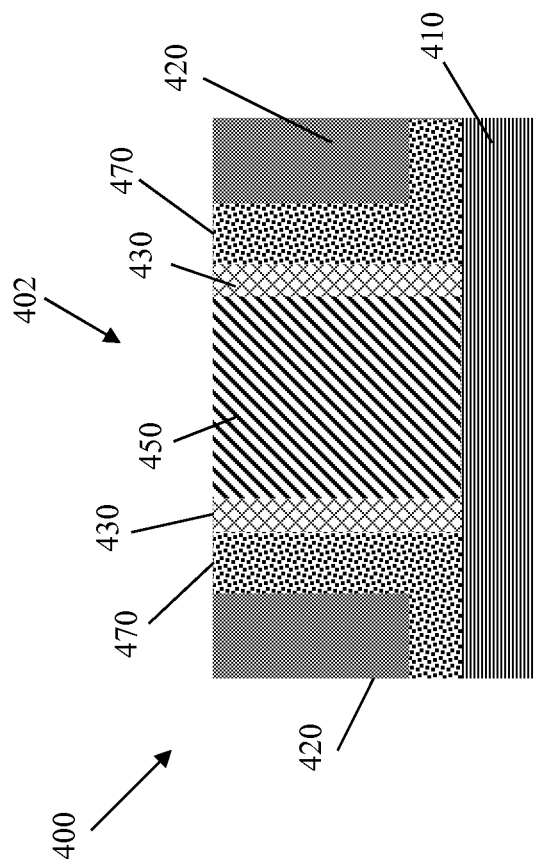
FIG. 3 is a demonstrative illustration of a graphical representation of a profile of a portion of a semiconductor device according to an embodiment of the invention.

Turning to the FIGURES, FIG. 3 is a demonstrative illustration of a cross sectional view of a portion of a semiconductor device 400 including a gate 402 according to embodiments. Semiconductor device 400 may include a gate conductor 450 which is disposed/formed in accordance with methods described herein directly (e.g., in direct physical contact) upon a substrate 410 (e.g., silicon layer). In one embodiment, gate conductor 450 may be formed within a dielectric layer 420. A barrier layer 430 and a set of spacers 470 may substantially separate gate conductor 450 and dielectric layer 420 from direct physical contact. Gate conductor 450 may include silicon germanium, titanium nitride, or other materials now known or later developed.

Further, gate conductor 450 may include any commonly used dielectric and/or gate material including, but not limited, to polysilicon or high melting point refractory metals, such as W, Ti, Ta, Mo, Nb, Re, Ru and their binary or ternary metallic derivatives, e.g., WN, TiN, TaN, MoN, MoO2, TaSiN. Gate conductor 450 may comprise any commonly used gate dielectric material including, but not limited, to oxide, nitride, oxynitride, and high-k materials such as hafnium silicate, zirconium silicate, hafnium dioxide, and zirconium dioxide. Further, gate conductor 450 may include silicon dioxide ($SiO_2$), silicon nitride (SiN), or any other material now known or later developed. Any number of dielectric regions may be located over the substrate, as many other layers included in semiconductor chips now known or later developed. In one embodiment, gate conductor 450 may include silicon dioxide ($SiO_2$) for its insulating, mechanical and optical qualities. Gate conductor 450 may also include, but is not limited to: silicon nitride ($Si_3N_4$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Substrate 410 may comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 410 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 410, as illustrated and described, are well known in the art and thus, no further description is necessary.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

FIGS. 4-11 are demonstrative illustrations of a device undergoing processes according to a method in accordance with an embodiment of the invention. In this method a gate 402 (shown in FIG. 3) is formed with a gate conductor 450 in direct contact (e.g., without any interfacial or residual layers, in physical contact with, etc.) with substrate 410 of semiconductor device 400. Although FIGS. 4-11 show the method of forming a portion of semiconductor device 400 in FIG. 3, it is understood that a similar method may be employed to form any other like semiconductor device.

Figure 4:
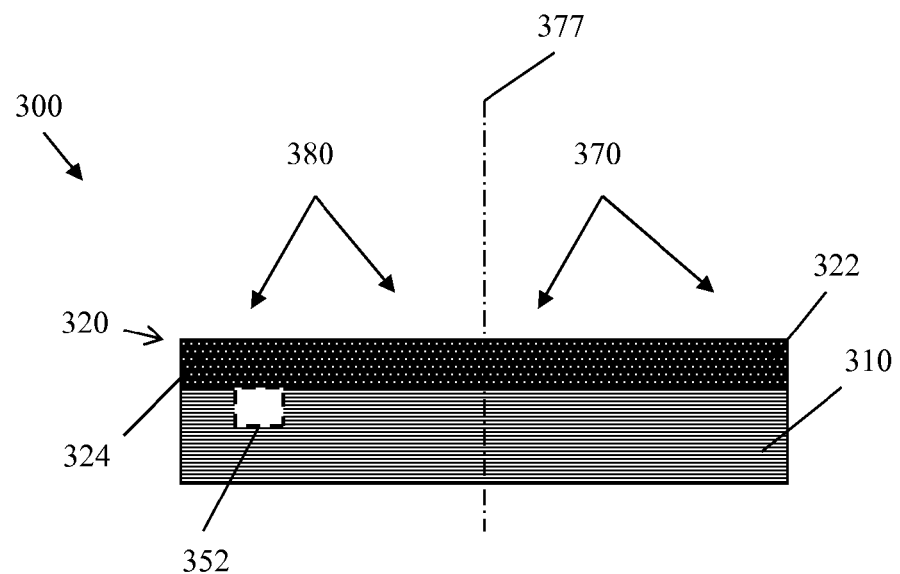
FIGS. 4-11 are demonstrative illustrations of a method of forming a semiconductor device according to embodiments of the invention.

Turning to FIG. 4, a demonstrative illustration of a substrate 310 in a semiconductor device 300 is shown in preparation for deposition of layers/formation of gate 402. Substrate 310 may include silicon or any other material commonly known and may be chemically cleaned. A second region 380 (e.g., a thick oxide EG portion, a region for connection with input/output devices, etc.) and a first region 370 (e.g., a thin oxide SG portion, a region for connection with high performance/logic devices, etc.) may be designated on semiconductor device 300 above substrate 310 as indicated by line 377. In one embodiment, a trench 352 (shown in phantom) may be etched in substrate 310. Trench 352 may be etched using any now known or later developed etching techniques. In one embodiment, etching of substrate 310 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

In an embodiment, an oxide layer 320 is formed on substrate 310, oxide layer 320 substantially covering a surface of substrate 310 including second region 380 and first region 370. Oxide layer 320 may include a first portion 322 disposed in first region 370 and a second portion 324 disposed in second region 380. In one embodiment, oxide layer 320 may have a thickness of about 6 microns (μm). In one embodiment, oxide layer 320 may include $SiO_2$, SiON, or like materials. It is understood that oxide layer 320 may be deposited using any deposition techniques described herein, now known, or later developed. In any event, following deposition of oxide layer 320, semiconductor device 300 may be polished to develop the surfaces.

Figure 5:
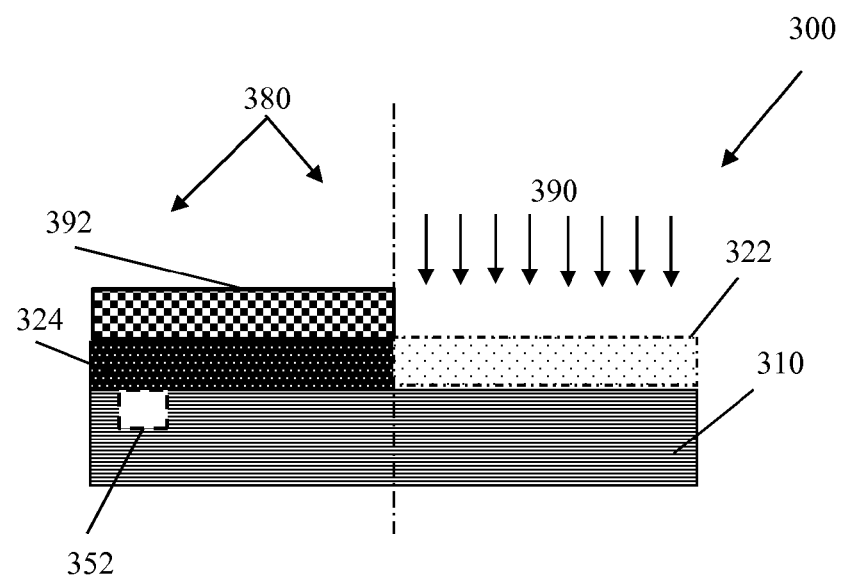

Next, in FIG. 5, a demonstrative illustration of semiconductor device 300 is shown during removal of first portion 322 (shown in phantom) of oxide layer 320 in first region 370 according to embodiments. Removal of first portion 322 may include patterning and/or selective etching as described herein, for example an etch 390 (e.g., a Dilute Hydro-Fluoric (DHF) rinse) may be performed to remove first portion 322 (e.g., portions of oxide layer 320 contained within first region 370 of semiconductor device 300). Etch 390 may include use of a mask layer 392 which may be selectively deposited on semiconductor device 300. In one embodiment, mask layer 392 may substantially cover second region 380, thereby protecting and retaining oxide layer 320 within second region 380.

Figure 6:
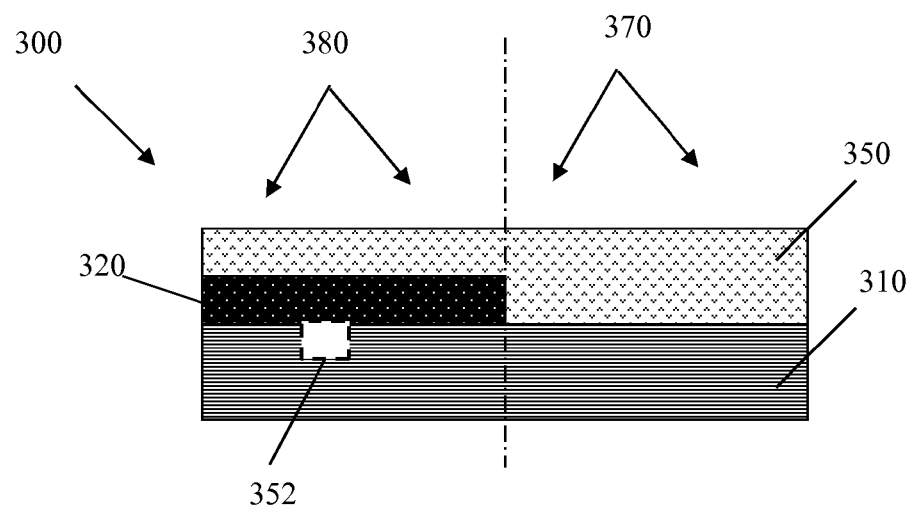

Next, in FIG. 6, a demonstrative illustration is shown of formation/deposition of a conductive dummy gate layer 350 (e.g., SiGe, TiN, Group III-IV materials, etc.) on semiconductor device 300. Conductive dummy gate layer 350 may be disposed upon both first region 370 and second region 380. In one embodiment, conductive dummy gate layer 350 may be disposed on second portion 324 (shown in FIG. 4) of oxide layer 320 in second region 380, and may directly contact/be disposed upon substrate 310 in first region 370. In one embodiment, conductive dummy gate layer 350 may be deposited through chemical vapor deposition and may include greater than about 30% silicon germanium.

Figure 7:
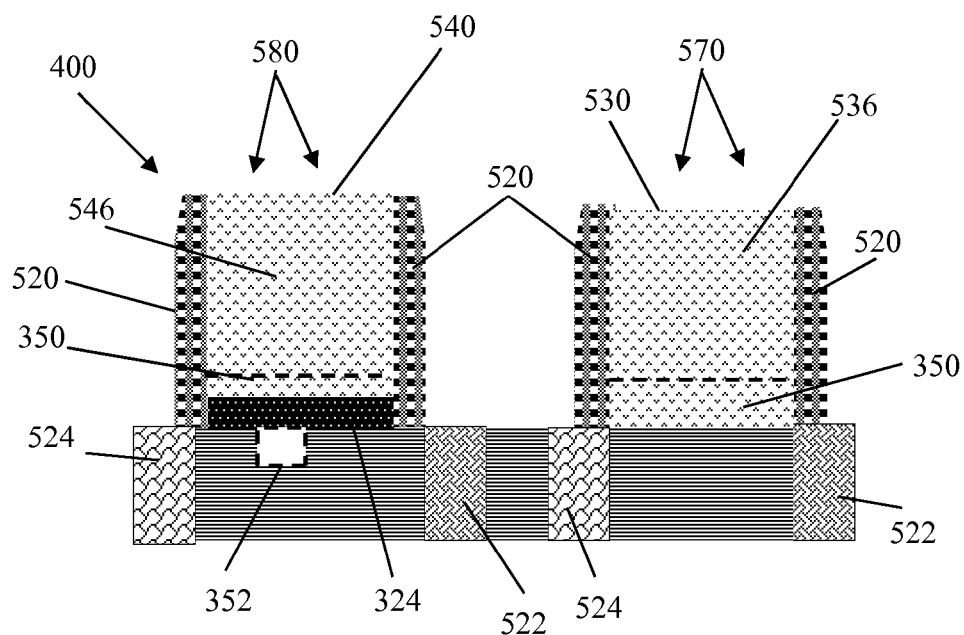

Turning now to FIG. 7, following deposition and/or formation of conductive dummy gate layer 350, semiconductor device 300 may be subjected to a replacement metal gate process to form a first region 570 and a second region 580 on semiconductor device 400. First region 570 and/or second region 580 may be formed on portions of conductive dummy gate layer 350 (shown in phantom). In one embodiment, portions of conductive dummy gate layer 350 may form portions of first dummy gate 530 and/or second dummy gate 540. In one embodiment, a material composition of conductive dummy gate layer 350 may be substantially similar to a material composition of portions of first dummy gate 530 and/or second dummy gate 540. The replacement metal gate process may form gate conductor 450 in direct contact (e.g., physical contact, disposed directly on) with substrate 410 through first region 370 and conductive dummy gate layer 350 contained therein. As shown in FIG. 7, semiconductor device 300 may be patterned, etched (e.g., RIE) and/or implanted to form a first dummy gate 530 in first region 370 and a second dummy gate 540 in second region 380. In an embodiment, first dummy gate 530 may include a first dummy contact 536 disposed on substrate 310 and second dummy gate 540 may include a second dummy contact 546 disposed on second portion 324 of oxide layer 320. First dummy gate 530 and second dummy gate 540 may include a set of spacers 520, a set of source regions 524 and a set of drain regions 522.

Figure 8:
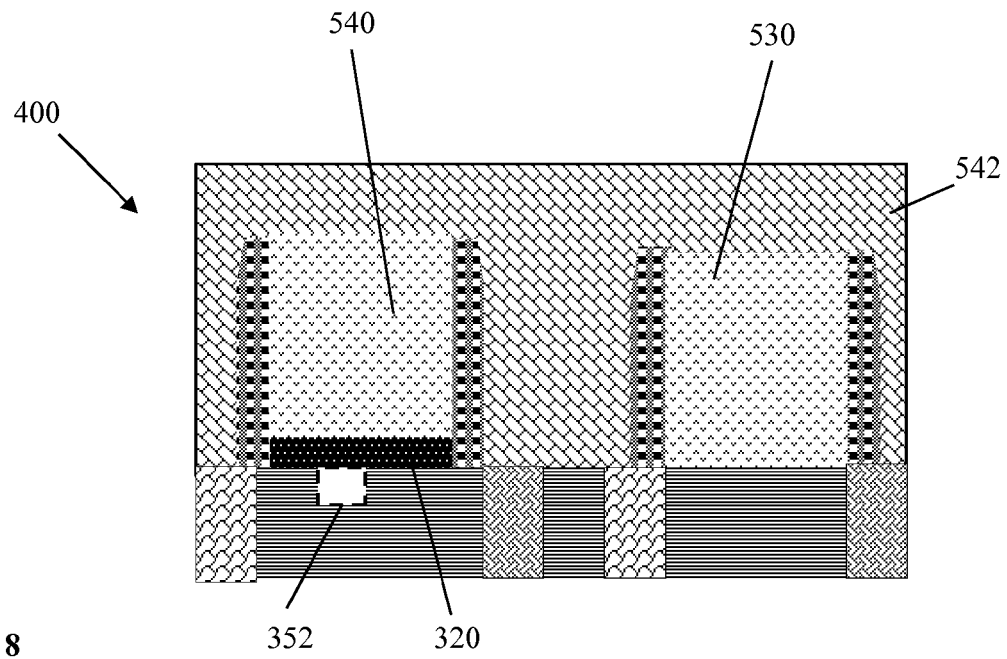
Figure 9:
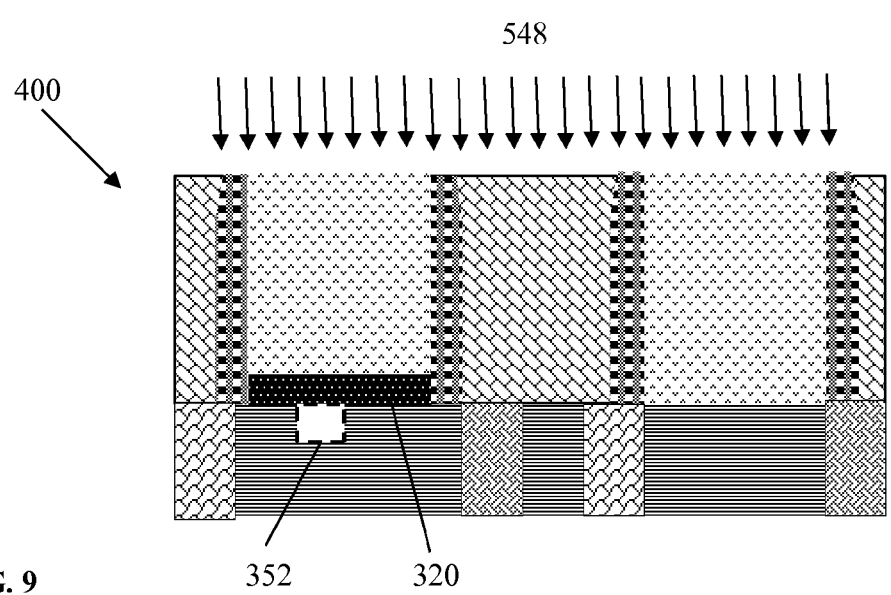

Next, in FIG. 8, a demonstrative illustration of deposition/formation of an insulation layer 542 on semiconductor device 400 and about first dummy gate 530 and second dummy gate 540. In one embodiment, insulation layer 542 may substantially cover a surface of semiconductor device 400, first dummy gate 530 and second dummy gate 540. Following deposition of insulation layer 542, in FIG. 9, a demonstrative illustration of semiconductor device 400 being subjected to a surface treatment 548 (e.g., a chemical mechanical polish 548, etc.) is shown according to embodiments. Surface treatment 548 may substantially smooth and/or level a surface of semiconductor device 400. In one embodiment, surface treatment 548 may reduce a thickness of insulation layer 542 and expose portions of first dummy gate 530 and second dummy gate 540.

Figure 10:
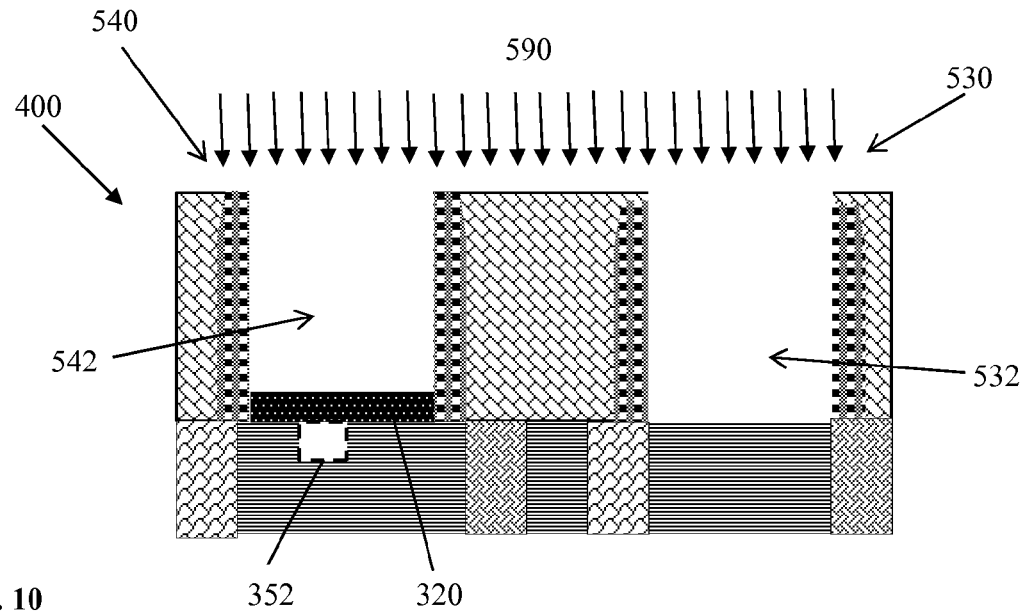
Figure 11:
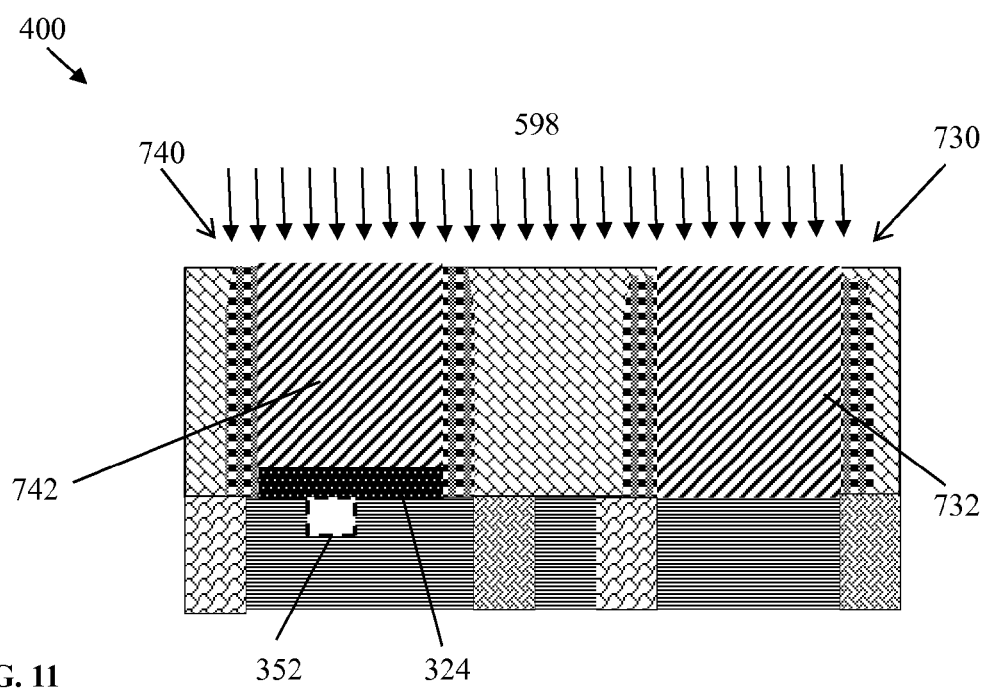

Next, in FIG. 10, a demonstrative illustration of semiconductor device 400 undergoing an etch/rinse/opening process in accordance with embodiments. In this embodiment, an opening process 590 is applied to semiconductor device 400 to remove portions of conductive dummy gate layer 350 retained within first dummy gate 530 and second dummy gate 540. Opening process 590 may include a wet chemistry operation, a mild DHF rinse, a siconi preclean, etching, etc. In an embodiment, opening process 590 may remove first dummy contact 536 and second dummy contact 546. Removal of portions of conductive dummy gate layer 350 may form a first conductor trench 532 in first dummy gate 530 and a second conductor trench 542 in second dummy gate 540. In one embodiment, opening process 590 may be DHF free. Following formation of first conductor trench 532 and second conductor trench 542, as shown in the demonstrative illustration of FIG. 11, semiconductor device 400 is subjected to a gate fill process 598 to form a first gate 730 and a second gate 740 on a semiconductor device 400. First gate 730 may include a first gate conductor 732 directly in contact with substrate 310 and second gate 740 may include a second gate conductor 742 disposed on second portion 324 of oxide layer 320. Gate fill process 598 may include gate dielectric formation, deposition of a thin interfacial layer, deposition of high-k dielectrics and/or deposition of a work function metal gate fill in first conductor trench 532 and/or second conductor trench 542.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
   forming an oxide layer on a substrate;
   removing a gate portion of the oxide layer from the substrate in a first region of the semiconductor device;
   forming a conductive dummy gate layer on the semiconductor device in the first region; and
   forming a gate on the semiconductor device, the gate including a gate conductor disposed in the first region and disposed directly on the substrate.

2. The method of claim 1, wherein the removing the gate portion of the oxide layer includes selective etching.

3. The method of claim 1, wherein the conductive dummy gate layer contains at least one of silicon germanium, titanium nitride, and tantalum nitride.

4. The method of claim 1, wherein the conductive dummy gate layer is formed directly on the substrate in the first region and on the oxide layer in a second region of the semiconductor device.

5. The method of claim 1, wherein the forming the gate on the semiconductor device includes a replacement metal gate process.

6. The method of claim 1, wherein the gate conductor is disposed directly on the conductive dummy gate layer and includes a material composition substantially similar to the conductive dummy gate layer.

7. The method of claim 1, wherein the removing the gate portion of the oxide layer includes exposing the substrate in the first region.

8. The method of claim 1, wherein the forming the conductive dummy gate layer on the semiconductor device includes selectively etching the conductive dummy gate layer in the first region.

9. A method of forming a semiconductor device, the method comprising:
   providing a substrate;
   forming an oxide layer on the substrate, the oxide layer including a first region and a second region;
   removing a gate portion of the oxide layer from the substrate in a first region of the semiconductor device, the removing includes converting the first region to a substantially oxide free region;
   forming a dummy gate on the semiconductor device in the first region; and
   forming a gate on the semiconductor device through replacement metal gate processes, the replacement metal gate processes being performed on the dummy gate;
   wherein the dummy gate is formed directly on the substrate in the first region.

10. The method of claim 9, wherein the removing the gate portion of the oxide layer includes selective etching.

11. The method of claim 9, wherein the forming the gate on the semiconductor device includes selective etching of the dummy gate.

12. The method of claim 9, wherein a gate conductor of the gate is disposed directly on the dummy gate and includes a material composition substantially similar to the dummy gate.

13. The method of claim 9, wherein the forming the dummy gate on the semiconductor device includes selectively etching the dummy gate.

14. The method of claim 9, wherein the removing the gate portion of the oxide layer includes exposing the substrate in the first region.

15. The method of claim 9, wherein the dummy gate contains at least one of silicon germanium, titanium nitride, and tantalum nitride.

16. A method of forming a semiconductor device, the method comprising:
   forming an oxide layer on a substrate, the oxide layer including a first portion on a first region of the substrate and a second portion on a second region of the substrate;
   removing the first portion of the oxide layer from the first region of the substrate;
   forming a conductive dummy gate layer that substantially covers the first region of the substrate and the second portion of the oxide layer; and
   forming a first gate in the first region of the substrate and a second gate in the second region of the substrate, the first gate including a first gate conductor directly connected to the substrate and the second gate including a second gate conductor formed on the second portion of the oxide layer.

17. The method of claim 16, wherein the forming the first gate and the second gate includes performing a replacement metal gate process.

18. The method of claim 16, further comprising:
   forming a first dummy gate in the first region and a second dummy gate in the second region following the forming of the conductive dummy gate layer, the first dummy gate including a first dummy contact disposed on the substrate and the second dummy gate including a second dummy contact disposed on the second portion of the oxide layer; and removing the first dummy contact from the first dummy gate and the second dummy contact from the second dummy gate.

19. The method of claim 16, wherein the removing the gate portion of the oxide layer includes selective etching.

* * * * *